United States Patent [19]
Yamazaki

[11] 3,805,130
[45] Apr. 16, 1974

[54] SEMICONDUCTOR DEVICE

[76] Inventor: Shumpei Yamazaki, 20-7, 1-chome, Shizuoka, Japan

[22] Filed: July 3, 1973

[21] Appl. No.: 376,154

Related U.S. Application Data

[63] Continuation-in-part of Ser. No. 192,810, Oct. 27, 1971, abandoned.

[30] Foreign Application Priority Data

Oct. 27, 1970 Japan .............................. 45-094483

[52] U.S. Cl. ...... 317/235 B, 317/235 G, 317/235 R, 307/304

[51] Int. Cl. ........................................... H01l 11/14

[58] Field of Search ........ 317/235 B, 235 G, 235 R; 307/304

[56] References Cited

UNITED STATES PATENTS 3,500,142 3/1970 Kahng ................................ 317/235

*Primary Examiner*—Martin H. Edlow
*Attorney, Agent, or Firm*—Holman & Stern

[57] ABSTRACT

A semiconductor device is disclosed having a layer of metal clusters or semiconductor clusters acting as trap centers for electrons or holes to control the electrical properties of the device.

29 Claims, 18 Drawing Figures

SEMICONDUCTOR DEVICE

PRIOR APPLICATION

This application is a Continuation-in-Part application of U.S. Patent application Ser. No. 192,810 filed Oct. 27, 1971, now abandoned.

BACKGROUND OF THE INVENTION

This invention is concerned with charge trapping layers in semiconductor devices.

Hitherto it is known to provide a semiconductor device such as a Field Effect Transistor, with a gate assembly designed for trapping charge carriers. Typical of such a device is that disclosed in U.S. Pat. No. 3,500,142. The gate assembly of the device of the above cited patent basically comprises a relatively thin insulating layer overlying the area of the semiconductor material between the drain and source electrodes, with a metallic layer sandwiched between this layer and an outer insulating layer connected to the gate terminal.

As will be observed the prior art device referred to, utilizes the metal layer sandwiched between the two insulating coatings, as a means for trapping electrons transported thereto during operation of the device, by the tunnel effect, through the insulating layer disposed over the area between the source and drain electrodes. This trapping layer, however, in contradistinction to the concepts of the instant invention, is fabricated to a thickness of about 1,000 angstroms and the outer insulating layer is then formed by a process of oxidation of the exposed surface of the trapping layer, to a further thickness of approximately 1,000 angstroms.

According to common prior knowledge, the trap centers in a crystal comprising such a trapping layer are considered to be created by an atomic defect therein. The instant invention, however, positively produces electron trap centers in a semiconductor device in the form of distinct and predetermined numbers of clusters of evaporated particles of a metal and/or a semiconductor material, thereby succeeding in controlling the electrical properties of such semiconductor devices.

SUMMARY OF THE INVENTION

According to the present invention, trap centers are artificially produced in the form of clusters of metal atoms or particles having a predetermined size and quantity at a predetermined position, so that the formed metal clusters trap the negative charge supplied thereto. The present invention also provides for metal and semiconductor clusters, semiconductor clusters to trap both electrons and holes, and metal clusters to trap electrons only. The present invention therefore basically produces in an artificial manner individual islands composed of clusters of metal particles in a predetermined quantity and at predetermined positions.

The present invention further provides for the utilization of the metal clusters in monolayers or multilayers on the boundary or near the boundary of a multilayered insulating coating incorporated into an insulator for a section of a MISFET (Metal Insulator Semiconductor Field Effect Transistor). The principal object of the invention therefore is to provide control means for the threshold voltage of the transistor utilizing electrical charge which is accumulated on the metal clusters. The present invention therefore serves to control the threshold voltage using the predetermined quantity of trapped electrons, which thereby enables a read-only memory of the MISFET to have write-in capabilities also. It is to be appreciated that prior art devices do not provide for charge trapping according to the principles of the instant invention. A charge trapping layer, such as that disclosed in U.S. Pat. No. 3,500,142, does not possess the control capabilities of the instant device. Although it is known to have a charge trapping layer processed in a discontinuous manner so as to minimize the effect of pinholes in an adjacent layer through which the charge is transported, nevertheless the trapping layers previously known have not envisaged the use of individual metal clusters of predetermined diameter and thickness. The trapping layer, for examples, disclosed in U.S. Pat. No. 3,500,142 is processed to a thickness of 1,000 angstroms. Athough it is disclosed that the trapping layer may be discontinuous as opposed to a continuous layer, nevertheless the formation of a discontinuous layer of 1,000 angstroms thickness would not produce individual metal clusters of predetermined thickness and diameter. The degree of discontinuity of a trapping layer having a thickness according to that in the cited reference would be quite large. To provide a discontinuous layer from a continuous layer of 1,000 angstroms thickness would require a photoetching process. This would result in a discontinuity between individual sites of the layer extending over a distance of one micron. The present invention however provides a trapping layer of from 5 to 100 angstroms thickness with individual circular clusters having diameters ranging from several tens of angstroms to 3,000 angstroms. A semiconductor device having a trapping layer processed according to the instant invention provides for improved control capabilities and extended application.

BRIEF DESCRIPTION OF THE DRAWINGS

The invention will be better understood from the following description taken with reference to the accompanying drawings wherein:

In FIG. 1, each drawing A, B and C has a cluster layer or a mixture of layers, represented at 3, respectively, between insulator 2 and 4. A substrate semiconductor, designated 1 in the drawings, is of germanium or gallium arsenide. A silicon semiconductor of $P_o = 1 \times 10^{15}cm^{-3}$ (100) is used as the substrate in this fabrication embodiment.

FIGS. 1 and 3 show only the gate section of an insulator gate type FET having a diode structure of metal insulator semiconductor (MIS), though the present invention is applicable to any FET, such as a self-align type, DSA (Diffusion Self-Align), MISFET (Metal Insulator Semiconductor Field Effect Transistor) which is also termed a microchannel MISFET. Also, a read-only memory, such as shown in FIGS. 2 and 4, can utilize a FET as a sensor, simply and exclusively.

In FIGS. 1 and 3, a cluster for trapping electrons may be composed of any metal. Any of the following materials, aluminum, beryllium, titanium, zirconium, tantalum, nickel, chromium, molybdenum, trungsten and barium may be used. Any material among the above that becomes an insulator when it is transformed into an oxide is suitable for forming the cluster Clusters formed from material such as the above are electrically isolated from each other. The metallic clusters are formed on an insulating film by the use of sputtering or vacuum evaporation. When material having a suitably high melting point is used, sputtering or vacuum evaporation using an electron beam is suitable. Resistance heating evaporation is used for materials not possessing the above required melting point.

During vacuum evaporation (the method used to produce clusters by vaporizing the substance in a vacuum chamber), the substrate on which the clusters are to be evaporated is kept at room temperature instead of heating it to about 300° to 500° C in the usual manner in a vacuum evaporating process so that formation of the metal cluster becomes easier.

In practice the metal is vaporized in 1 to 2 seconds with a very slow evaporation speed so that clusters of the required diameter of 5 to 100A are produced.

When aluminum, beryllium, titanium or zirconium is used for the cluster material it is more preferable to employ a CVD (Chemical Vapor Deposition) method. The method for the deposition of metallic clusters is that the chloride gas of the above materal is deposited with a carrier gas of hydrogen or nitrogen on the predetermined surface. In this method, the chloride on the surface is decomposed in order to concentrate the decomposed metal. Metal clusters having diameters of 10A to 1,200A are thus formed on the substrate.

In the CVD process, $AlCl_3$ is brought into a reactive tube at flowing rate of 0.5 to 2 cc/min. for 5 to 30 seconds to form clusters having an average thickness of 30A.

In the present invention, therefore, a cluster is a collection of particles which when disposed over a surface to form a coating, the coating has an average thickness of 300A. When the thickness reaches more than 500 A, the resulting layer is similar to the floating gate of known devices. A thickness of 500A at the very least will produce pinholes on the coating 2 due to thermal strain or mechanical distortion which is generated during the processing, and thus the part designated 3 will become ineffective as a trap center.

Figure 1:
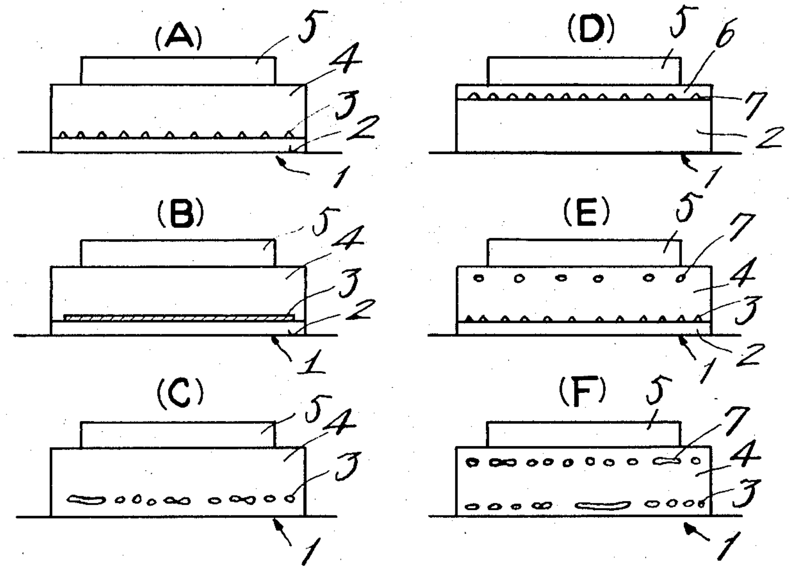
FIG. 1 shows an enlarged cross-section of a MIS type diode structure embodying the principles of this invention.

In FIG. 1, an insulator such as silicon oxide, silicon nitride or aluminum oxide was coated to a thickness of 5 to 100A on the silicon substrate. The substrate with a completely cleaned surface, was heated in an electric furnace with steam or wet oxygen ambients at a temperature of 600° to 850° C for 5 to 60 minutes. Thus, a solid-gas phase oxidation was used.

In the CVD process, the silicon oxide was produced by the reaction of silane and oxygen while keeping the temperature of the substrate at 350° to 450° C as in common prior practice. The silicon nitride was produced by the thermal decomposition of silane and ammonia at the temperature of 650° to 750° C. $SiH_4$ of 2 cc/min., $NH_3$ of 150 cc/min. and $N_2$ of 2.5 1/min were used there. The aluminum oxide can be processed by sputtering, however, the CVD process was used in this embodiment. $CO_2$ of 50 cc/min., $H_2$ with saturated $AlCl_3$ of 50 to 5,000 cc/min. was added. In the following discussion, the silicon oxide, silicon nitride and aluminum oxide was produced using either of the above described processes.

In FIGS. 1A and 1B, the insulator coating 2 is processed on the silicon substrate 1 with 5 to 100A thickness. The drawings are only schematic illustrations, although a micrograph reveals that coating 2 is uneven except the silicon oxide which was produced by a solid-gas phase reactive process. In an evaporation process, if the temperature of the substrate is kept high such as at 300° to 500° C, a coating of metal in the form of a layer will be obtained. The thickness of the insulating coating 2 is thin, and thus pinholes on the coating will leak the trapped charge. It will be obvious therefore that trap centers having a cluster structure according to the instant invention are superior to trap centers in a normal coating, since in the cluster structure leakage of charge trapped in one cluster through a pinhole defect is not coupled with the charge trapped in another cluster. Clusters having diameters of from 5A to 1,200A and cluster layers of 20A to 100A thickness were measured in this embodiment. In general, however, the thickness of a cluster layer is about 500A. A CVD process may also be used to form the cluster 3.

In order to electrically isolate the clusters of layers 3 and/or 7 from each other, the gate section is heated at a temperature of 300° to 600° C in clean air or in oxygen after the clusters have been formed. By so doing, leakage of the charge trapped in one cluster from a pinhole on the coating 2 is isolated from the remaining clusters. Thus, the remaining clusters act as trap centers.

The above process should be performed carefully, if the thickness of the coating 2 is less than 100A. Then, an insulator coating 4 is fabricated by a CVD process. The requirements for the insulator coating are to exclude clusters except for a negligible amount, and to be contamination-free. Silicon nitride or metal-oxide coatings, such as alumina, beryllia, titanium oxide and tantalum oxide, are suitable for the coating. However silicon oxide is not suitable because it is susceptible to contamination and has a low dielectric constant. The thickness of the coating 4 is ten times that of the coating 2, in general. If the thickness is not adequate, the cluster layer will become as shown in FIG. 1C where it is located in the upper region. If the cluster layer 3 is formed by a CVD process and the coating 4 above the cluster is made of the oxide of the material used for the layer 3, the same reactive furnace can be used to fabricate both layers 3 and 4.

As a result, the hysteresis in the C-V characteristic (capacitance-gate voltage curve) is directed to the opposite side. On the other hand, if the thickness is too great, the electric field at the insulator coating 2 injecting electrons from the substrate to the trap center by the tunnel effect will be minimal.

In the extreme case, the electric field will reach above 100 V. The thickness of the coating shall be limited to a maximum of 2,000A. In practice, the thicknesses were between 300 tp 1,000 due to the limitations of productivity. If the thickness of the insulator coating 4 is 5 to 25A, then both electrons and holes will reach the trap center, and therefore the electons trapped in the center will be neutralized by the holes. However, if the cluster is made of metal, a trapped hole cannot be obtained. It was found in the present invention that if the thickness of the insulator coating 4 is adequate compared to the diffusion rate of the hole, the trap center will trap only electrons and if it is insufficient, the holes will recombine with the electrons trapped.

Then, the electrode 5 is fabricated using either aluminum, doped silicon or platinum.

Figure 2:
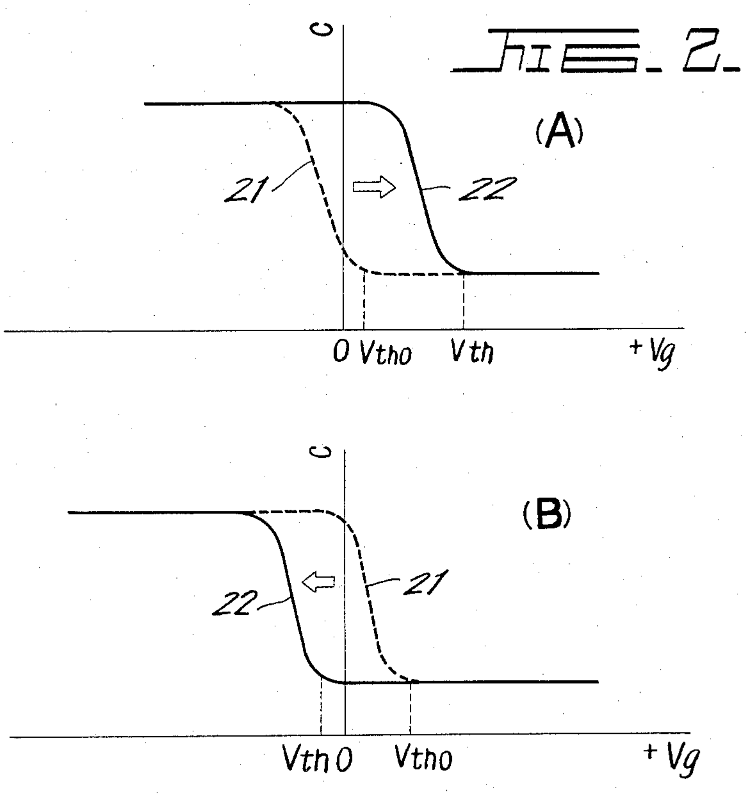
FIG. 2A is a C-V characteristic for the diode shown in FIG. 1A, 1B, and 1C.
FIG. 2B is a C-V characteristic for the diode shown in FIG. 1D.

FIG. 2A shows an exemplary characteristic of a MIS diode fabricated as described above. The Y axis represents capacitance, and the X axis is gate electrode voltage. A broken line 21 in the drawing shifts to the right side with the positive potential Vi for the gate and changes into the solid line 22. As a result, the threshold voltage Vtho changes into Vth, thereby allowing the operating characteristic of the MISFET to be changed. As the trap center traps electrons only and it is not a dual type such as would be exhibited by a semiconductor cluster, the trapped charge is never released. Thus, the memorized Vth is unchanged, in an almost permanent fashion. In this case, the thickness of the insulator coating 2 is between 25 and 100A. If the thickness is less than 25A, the negative potential Vi for the gate will shift the line 22 to the left without exceeding the position of the line 21. Because a hole reaches a cluster by the tunnel effect, it thereby recombines with electrons trapped there. A lower voltage is desirable to change the Vth for the MISFET.

Consequently, metal having a greater work function such as platinum is preferable as these metals make the injection of the electron easier. However, platinum should be diffused into the insulator coating 2 when it is heated and in practice it is therefore not suitable as the trap center.

Aluminum, molybdenum, titanium, zirconium, nickel and chromium having a work function between 4.0 and 5.0 eV have been selected in the embodiment. As shown in FIG. 1D, the cluster layer can be fabricated near the electrode and the insulator coating 2 can be made thick. The characteristic of this embodiment is shown in FIG. 2B. The initial curve 21 is on the right side and shifts to the left changing into the line 22, and thereby Vtho changes into Vth.

FIGS. 1B and 1E show layers of metal clusters fabricated near the substrate and electrode respectively. FIG. 1E shows a different concentration of the cluster layer at 7 and 3. FIG. 1E shows the cluster layer comprising a different metal than FIG. 1D. In both cases, because of the two trap centers, one center is able to shift the characteristic to the right as shown in FIG. 2A and the other to the left as shown in FIG. 2B. It was found that the shift in FIG. 2B type was small compared to the shift in FIG. 2A type even though the same quantity of the metal was included in the insulator coating.

A material having lower work function material is used for forming the metal clusters such as barium and aluminum to accelerate the infiltration of the hole through the insulator coating 2. The insulator coating 2 is silicon nitride having a thickness of 5 to 25A.

On the coating 2, aluminum metal clusters are to be deposited by the SVD process, and over this layer, aluminum oxide is to be fabricated as the insulator coating 4 using the same reactive furnace.

After the above process, the cluster layers 3 and 7 must be kept constant even while the gate section is annealed at a temperature of 300° to 500° C for 1 to 50 hours.

Figure 3:
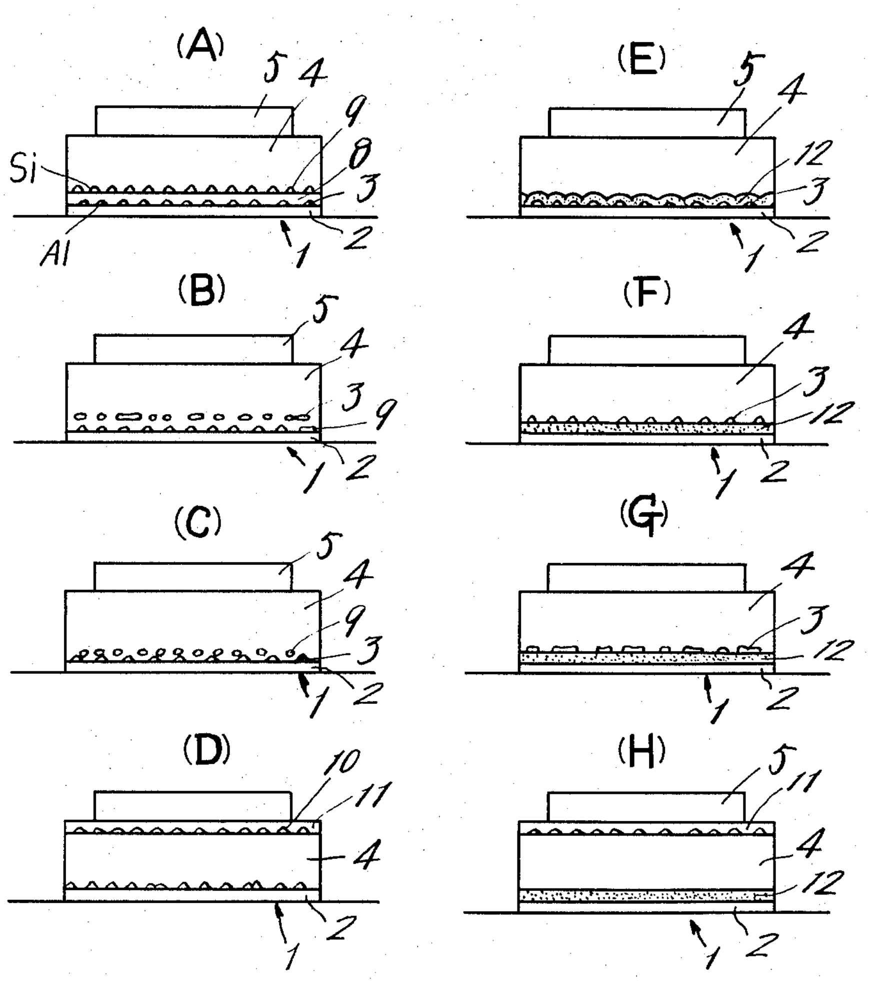
FIG. 3 is an enlarged cross-section of a structure embodying the principles of the instant invention including the use of a semiconductor cluster.
Figure 4:
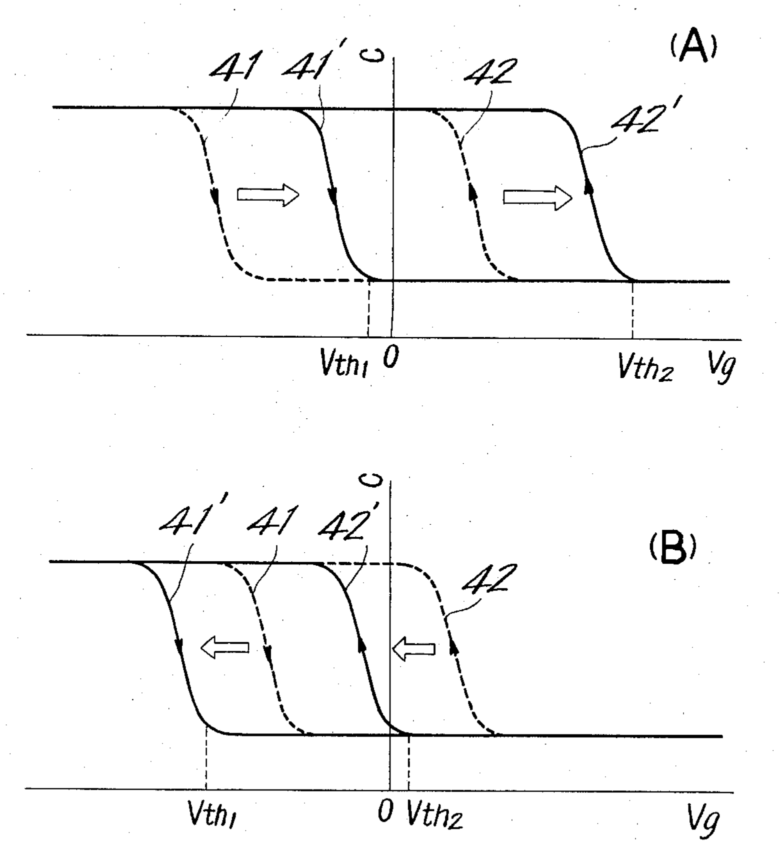
FIG. 4 is a C-V characteristic for the structure shown in FIG. 3.

FIG. 3 shows devices useful for a memory with write-in capabilities and rewrite-in speed less than 1 microsecond having a nonvolatile memory feature. In the drawings, numeral 9 indicates clusters made of semiconductor material while numerals 3 and 10 show clusters made of metal. As the semiconductor clusters trap the electrons and holes, hysteresis curves shown in FIG. 4 are obtained.

The silicon clusters were fabricated by the CVD process. $SiH_4$ of 2 cc/min., and $N_2$ or $H_2$ of 1 to 2.5 l/min. for 5 seconds to 1 minute produced a cluster layer of average thickness 5 to 100A. The temperature of the substrate was kept at 650° to 750° C. It was found in the experiment that after the silane decomposed thermally, the decomposed products polymerized each other producing the clusters. Utilizing this feature, the clusters were formed. Silicon nitride was selected as the insulator coating because oxide such as silicon oxide reacts with the clusters and renders them of no effect.

Additionally, silicon nitride, titanium oxide and tantalum oxide and alumina have been used. Alumina has a negligible effect on the clusters, although its excessive oxygen reduces their size to some extent.

FIG. 3 depicts various structures having different distribution and composition of clusters, where A and B have both semiconductor and metal clusters in two separated layers respectively. However, FIG. 3A has silicon clusters in the upper layer, whereas FIG. 3B has them in the lower layer. The configuration shown in FIG. 3A shifts the Vth a greater distance, whereas FIG. 3B makes the hysteresis larger. FIG. 3C includes both semiconductor and metal clusters in the same layer electrically isolated from each other, otherwise, holes trapped in the semiconductor clusters will recombine with electrons in the metal clusters which of course is undesirable.

FIG. 4A was obtained using the configuration of FIG. 3B.

To shift the direction reverse of that shown in FIG. 3B, FIG. 3D should be used, as described with regard to FIG. 1.

In FIGS. 3E, 3F, 3G and 3H, the layers 12 are layers of silicon nitride having silicon clusters processed with a flow rate ratio of $NH_3/SiH_4$ in 0.01 to 1.0.The cluster is isolated by the silicon nitride. Therefore, the above configuration has good electrical isolation and resists heat during annealing.

The metal clusters such as used for 3 in FIG. 1A are produced from a metal chloride, for example, by the reaction between aluminum chloride or titanium chloride and carbonic acid gas with the ratio of metal chloride and oxide in 0.01 to 1.0 aluminum oxide or titanium oxide including many clusters is obtained. The coating 6 on top of the cluster 3 is made of silicon nitride, aluminum oxide, titanium oxide, tantalum oxide, etc., having a negligible amount of clusters or including no clusters.

The configuration of drawing E of FIG. 3 consists of substrate 1, silicon oxide 2, metal clusters 3, silicon nitride 12 including clusters, aluminum oxide insulator coating 4 having no clusters, and a gate electrode 5.

The drawing F of FIG. 3 has a similar configuration to the drawing E having the metal clusters 3 on the layer 12. The drawing G has mixed metal clusters similar to the drawing F.

The drawing H is a combination of the drawing D and the drawing F except for the metal clusters 3.

As described above, the present invention produced electron trap centers in a predetermined manner, wherein a trap center is composed of a metal cluster thereby controlling the Vth of a MISFET.

The invention in its broader aspects is not limited to the specific examples illustrated and described. The invention can be applied to a general integrated circuit as well as to a semiconductor read-only memory, random access memory, etc.

What is claimed is:

1. A semiconductor device comprising:
a semiconductor substrate having a surface;
an insulating coating having an upper and lower surface disposed on said substrate so that said lower surface is contiguous to said substrate surface;
a gate electrode on said upper surface of said insulating coating;
at least one layer comprising a plurality of substantially circular and electrically isolated clusters composed of particles of a metal disposed at predetermined positions within said insulator coating, said at least one layer having a thickness within the range 20A to 100A, said plurality of isolated clusters having diameters within the range 5 to 1,200A.

2. A semiconductor device comprising:
a semiconductor substrate having a surface;
an insulating coating having an upper and lower surface disposed on said substrate so that said lower surface is contiguous to said substrate surface;
a gate electrode on said upper surface of said insulating coating;
at least two layers, one layer comprising a plurality of substantially circular and electrically isolated clusters composed of particles of a metal, the other layer comprising a plurality of substantially circular and electrically isolated clusters composed of particles of a semiconductor material, disposed at predetermined positions within said insulator coating, each of said at least two layers having a thickness within the range 20 to 100A, said clusters of each layer having diameters within the range 5 to 1,200A.

3. A device as claimed in claim 1 wherein said at least one layer is disposed in said insulator coating nearer said surface of said semiconductor substrate than said upper surface of said insulating coating.

4. A device as claimed in claim 1 wherein said at least one layer is disposed in said insulator coating nearer said upper surface of said insulating coating than said surface of said semiconductor substrate.

5. A device as claimed in claim 1 wherein said insulating coating has at least two layers comprising said clusters one disposed near its upper surface the other disposed near its lower surface.

6. A device as claimed in claim 2 wherein said at least two layers are disposed in said insulator coating nearer said surface of said semiconductor substrate than said upper surface of said insulating coating.

7. A device as claimed in claim 2 wherein said one layer is disposed beneath said other layer said one layer being nearer said semiconductor substrate than said other layer and said upper surface of said insulating coating.

8. A device as claimed in claim 2 wherein said other layer is disposed beneath said one layer, said other layer being nearer said semiconductor substrate than said one layer.

9. A device as claimed in claim 3 wherein said plurality of metal clusters are formed by vacuum evaporation said clusters having diameters within the range 5 to 100A.

10. A device as claimed in claim 4 wherein said plurality of metal clusters are formed by vacuum evaporation said clusters having diameters within the range 5 to 100A.

11. A device as claimed in claim 5 wherein said plurality of metal clusters are formed by vacuum evaporation said clusters having diameters within the range 5 to 100A.

12. A device as claimed in claim 9 wherein said plurality of metal clusters are formed by chemical vapor deposition, said clusters having diameters within the range 10A to 1,200A.

13. A device as claimed in claim 10 wherein said plurality of metal clusters are formed by chemical vapor deposition, said clusters having diameters within the range 10A to 1,200A.

14. A device as claimed in claim 11 wherein said plurality of metal clusters are formed by chemical vapor deposition, said clusters having diameters within the range 10A to 1,200A.

15. A device as claimed in claim 6 wherein said semiconductor clusters have diameters within the range 10 to 1,200A said layer of clusters composed of semiconductor material having a thickness within the range 5 to 100A.

16. A device as claimed in claim 7 wherein said semiconductor clusters have diameters within the range 10 to 1200A said layer of clusters composed of semiconductor material having a thickness within the range 5 to 100A.

17. A device as claimed in claim 8 wherein said semiconductor clusters have diameters within the range 10 to 1,200A said layer of clusters composed of semiconductor material having a thickness within the range 5 to 100A.

18. A device as claimed in claim 12 wherein said metal particles forming clusters are selected from the group consisting of aluminum, beryllium, titanium, zirconium, tantalum, nickel, chromium, molybdenum, tungsten, and barium.

19. A device as claimed in claim 13 wherein said metal particles forming clusters are selected from the group consisting of aluminum, beryllium, titanium, zirconium, tantalum, nickel, chromium, molybdenum, tungsten, and barium.

20. A device as claimed in claim 14 wherein said metal particles forming clusters are selected from the group consisting of aluminum, beryllium, titanium, zirconium, tantalum, nickel, chromium, molybdenum, tungsten, and barium.

21. A device as claimed in claim 15 wherein said semiconductor material forming clusters is selected from the group consisting of silicon and germanium.

22. A device as claimed in claim 16 wherein said semiconductor material forming clusters is selected from the group consisting of silicon and germanium.

23. A device as claimed in claim 17 wherein said semiconductor material forming clusters is selected from the group consisting of silicon and germanium.

24. A device as claimed in claim 18 wherein said insulating coating comprises at least one of silicon nitride, silicon oxide, aluminum oxide, tantalum oxide, beryllium oxide.

25. A device as claimed in claim 19 wherein said insulating coating comprises at least one of silicon nitride, silicon oxide, aluminum oxide, tantalum oxide, beryllium oxide.

26. A device as claimed in claim 20 wherein said insulating coating comprises at least one of silicon nitride, silicon oxide, aluminum oxide tantalum oxide, beryllium oxide.

27. A device as claimed in claim 21 wherein said insulating coating comprises at least one of silicon nitride, silicon oxide, aluminum oxide, tantalum oxide, beryllium oxide.

28. A device as claimed in claim 22 wherein said insulating coating comprises at least one of silicon nitride, silicon oxide, aluminum oxide, tantalum oxide, beryllium oxide.

29. A device as claimed in claim 23 wherein said insulating coating comprises at least one of silicon nitride, silicon oxide, aluminum oxide, tantalum oxide, beryllium oxide.

* * * * *